United States Patent
Wang et al.

(10) Patent No.: US 10,123,441 B2
(45) Date of Patent: Nov. 6, 2018

(54) MEMORY DEVICE WITH DAUGHTER BOARD FASTENING STRUCTURE

(71) Applicant: Shannon Systems Ltd., Shanghai (CN)

(72) Inventors: Xinglong Wang, Shanghai (CN); Jia He, Shanghai (CN); Xiaoyan Chen, Shanghai (CN)

(73) Assignee: SHANNON SYSTEMS LTD., Shanghai (CN)

( * ) Notice: Subject to any disclaimer, the term of this patent is extended or adjusted under 35 U.S.C. 154(b) by 0 days.

(21) Appl. No.: 15/469,798

(22) Filed: Mar. 27, 2017

(65) Prior Publication Data

US 2018/0184537 A1    Jun. 28, 2018

(30) Foreign Application Priority Data

Dec. 28, 2016    (CN) .......................... 2016 1 1232739

(51) Int. Cl.
| | |
|---|---|
| *H05K 7/02* | (2006.01) |
| *H05K 7/14* | (2006.01) |
| *H05K 7/20* | (2006.01) |
| *H05K 1/02* | (2006.01) |
| *H05K 1/18* | (2006.01) |
| *H05K 1/14* | (2006.01) |

(Continued)

(52) U.S. Cl.
CPC ............. *H05K 7/026* (2013.01); *H05K 1/141* (2013.01); *H05K 1/189* (2013.01); *H05K 7/20409* (2013.01); *G11C 5/02* (2013.01); *H01L 23/367* (2013.01); *H05K 1/0203* (2013.01); *H05K 1/147* (2013.01); *H05K 2201/042* (2013.01); *H05K 2201/066* (2013.01); *H05K 2201/10159* (2013.01); *H05K 2201/10189* (2013.01)

(58) Field of Classification Search
CPC .......................... H05K 7/2039–7/20518; H05K 2201/06–2201/068; H05K 2201/10416; H05K 1/0201–1/0203; H01L 23/36; H01L 23/3677; H01L 23/40–23/4006; H01L 23/4093
USPC ....... 361/709–710, 719; 165/80.1–80.3, 185; 257/718–719, 721–722
See application file for complete search history.

(56) References Cited

U.S. PATENT DOCUMENTS

| | | | |
|---|---|---|---|
| 7,400,506 B2 * | 7/2008 | Hoss .................... | H01L 23/4093 165/185 |
| 7,474,529 B2 * | 1/2009 | Tian ......................... | G11C 5/04 165/185 |

(Continued)

*Primary Examiner* — Zachary Pape
(74) *Attorney, Agent, or Firm* — McClure, Qualey & Rodack, LLP

(57) ABSTRACT

A memory device is provided. The memory device includes a motherboard, a controller, a first memory unit, a second memory unit and a heat sink. The motherboard includes a contact portion. The controller is disposed on the motherboard and corresponds to the contact portion. The first memory unit is coupled to the motherboard. The first memory unit is located on one side of the controller. The first memory unit includes a plurality of first memory chips. The second memory unit is coupled to the motherboard. The second memory unit is located on another side of the controller. The second memory unit includes a plurality of second memory chips. The heat sink is thermally connected to the controller. The heat sink is located between the first memory unit and the second memory unit.

4 Claims, 10 Drawing Sheets

(51) Int. Cl.
*H01L 23/367* (2006.01)
*G11C 5/02* (2006.01)

(56) References Cited

U.S. PATENT DOCUMENTS

| | | | | |
|---|---|---|---|---|
| 7,907,419 B2* | 3/2011 | Costello | ................ | H05K 7/142 |
| | | | | 174/138 E |
| 8,706,932 B1* | 4/2014 | Kanapathippillai | ........................ | |
| | | | | G06F 13/1694 |
| | | | | 710/62 |
| 9,898,056 B2* | 2/2018 | Dean | ........................ | G06F 1/20 |
| 2008/0266807 A1* | 10/2008 | Lakin | ................ | H05K 7/20409 |
| | | | | 361/709 |
| 2010/0241799 A1* | 9/2010 | Schuette | ............... | G06F 3/0626 |
| | | | | 711/104 |
| 2010/0254093 A1* | 10/2010 | Oota | ................ | B60R 16/0239 |
| | | | | 361/720 |
| 2013/0279232 A1* | 10/2013 | Sharette | ................ | H01L 23/36 |
| | | | | 365/51 |

\* cited by examiner

MEMORY DEVICE WITH DAUGHTER BOARD FASTENING STRUCTURE

CROSS REFERENCE TO RELATED APPLICATIONS

This Application claims priority of China Patent Application No. 201611232739.0, filed on Dec. 28, 2016, the entirety of which is incorporated by reference herein.

BACKGROUND OF THE INVENTION

Field of the Invention

The present invention relates to a memory device, and in particular to a solid-state memory device.

Description of the Related Art

In conventional solid-state memory cards, a controller is disposed on a surface of the solid-state memory card, and is adjacent to an edge that is away from the contacts (eccentrically arranged). Therefore, the distance between the controller and the contacts is increased, and this causes the quality of signals therebetween weakened.

BRIEF SUMMARY OF THE INVENTION

In one embodiment, a memory device is provided. The memory device includes a motherboard, a controller, a first memory unit, a second memory unit and a heat sink. The motherboard comprises a contact portion. The controller is disposed on the motherboard and corresponds to the contact portion. The first memory unit is coupled to the motherboard. The first memory unit is located on one side of the controller. The first memory unit comprises a plurality of first memory chips. The second memory unit is coupled to the motherboard. The second memory unit is located on another side of the controller. The second memory unit comprises a plurality of second memory chips. The heat sink is thermally connected to the controller. The heat sink is located between the first memory unit and the second memory unit.

In one embodiment, the number of first memory chips is equal to the number of second memory chips.

In one embodiment, the first memory chips and the second memory chips are disposed on the motherboard.

In one embodiment, the first memory unit comprises a first daughter board. The second memory unit comprises a second daughter board. The first memory chips are disposed on the first daughter board. The second memory chips are disposed on the second daughter board. The first daughter board and the second daughter board are coupled to the motherboard.

In one embodiment, the memory device further comprises a metal plate. The motherboard comprises a first surface and a second surface. The controller is disposed on the first surface. The metal plate is affixed to the second surface.

In one embodiment, the motherboard comprises a metal layer. The metal plate is thermally connected to the metal layer.

In one embodiment, the memory device further comprises a first flexible print circuit and a second flexible print circuit. The first daughter board is coupled to the motherboard by the first flexible print circuit. The second daughter board is coupled to the motherboard by the second flexible print circuit.

In one embodiment, the motherboard comprises a first connector, a second connector, a third connector and a fourth connector. The first daughter board is connected to the first connector and a second connector. The second daughter board is connected to the third connector and the fourth connector.

In one embodiment, the heat sink comprises a plurality of fins. The extending direction of the fins is parallel to the extending direction of the first connector, the second connector, the third connector and the fourth connector.

In one embodiment, the memory device further comprises a plurality of first fasteners and a plurality of second fasteners. The first daughter board comprises a plurality of first connection posts. The second daughter board comprises a plurality of second connection posts. The first fasteners pass the metal plate and the motherboard and are affixed to the first connection posts. The second fasteners pass the metal plate and the motherboard and are affixed to the second connection posts.

In one embodiment, the memory device is a full-height peripheral component interconnect memory card. The first memory chips sequentially comprise a first chip row, a second chip row, a third chip row and a fourth chip row. The first connector is located between the first chip row and the second chip row. The second connector is located between the third chip row and the fourth chip row.

In one embodiment, the memory device is a half-height peripheral component interconnect memory card. The first memory chips are located between the first connector and the second connector.

Utilizing the embodiment of the invention, the distance between the controller and the contact portion is decreased. Therefore, the lengths of the traces are decreased, the signal strength is increased, and transmission quality is improved. A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
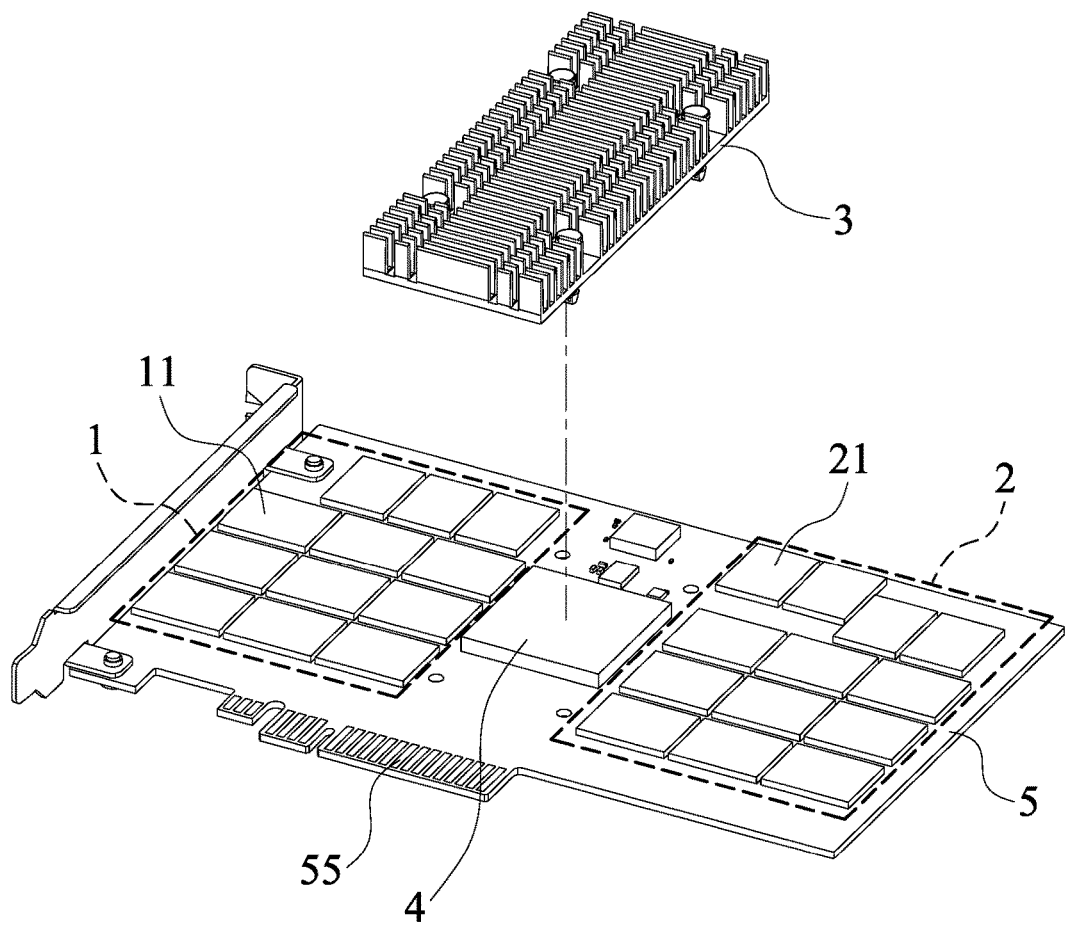
FIG. 1A is an exploded view of a memory device of a first embodiment of the invention.
Figure 1B:
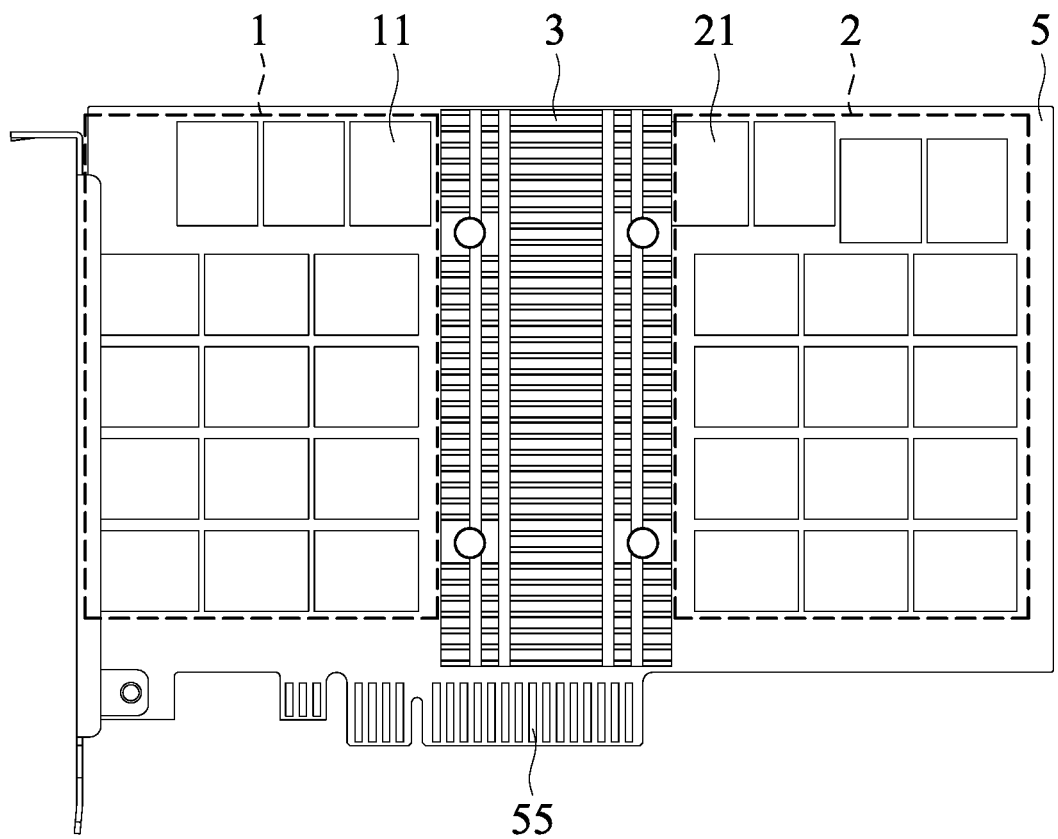
FIG. 1B is a top view of the memory device of the first embodiment of the invention.

FIGS. 1A and 1B show a memory device M1 of a first embodiment of the invention. The memory device M1 includes a motherboard 5, a controller 4, a first memory unit 1, a second memory unit 2 and a heat sink 3. The motherboard 5 comprises a contact portion 55. The controller 4 is disposed on the motherboard 5 and electrically coupled to the contact portion 55. The first memory unit 1 is coupled to the motherboard 5. The first memory unit 1 is located on one side of the controller 4. The first memory unit 1 comprises a plurality of first memory chips 11. The second memory unit 2 is coupled to the motherboard 5. The second memory unit 2 is located on another side of the controller 4. The second memory unit 2 comprises a plurality of second memory chips 21. The heat sink 3 is thermally connected to the controller 4. The heat sink 3 is located between the first memory unit 1 and the second memory unit 2.

In one embodiment, the controller 4 can be a FPGA (Field-Programmable Gate Array) chip or an ASIC (Application Specific Integrated Circuit).

Utilizing the embodiment of the invention, the distance between the controller 4 and the contact portion 55 is decreased. Therefore, the lengths of the signal lines are decreased, the signal strength is increased, and signal quality is improved.

With reference to FIGS. 1A and 1B, in one embodiment, to symmetrically arrange the memory chips, the number of first memory chips 11 is preferably equal to the number of second memory chips 21. In one embodiment, the controller 4 is adapted to be coupled to the same numbers of the first memory chips 11 and the second memory chips 21. The capacity of the first memory chips 11 can differs from the capacity of the second memory chips 21. By choosing different memory chips of different capacities, the capacity of the memory device M1 is able to satisfy different requirements of different demands. The disclosure is not meant to restrict the invention. In another embodiment, the number of first memory chips 11 can also differ from the number of second memory chips 21, so the arrangement is either substantially symmetrically or even asymmetrically.

With reference to FIGS. 1A and 1B, in one embodiment, the first memory chips 11 and the second memory chips 21 are directly disposed on the motherboard 5.

Figure 2A:
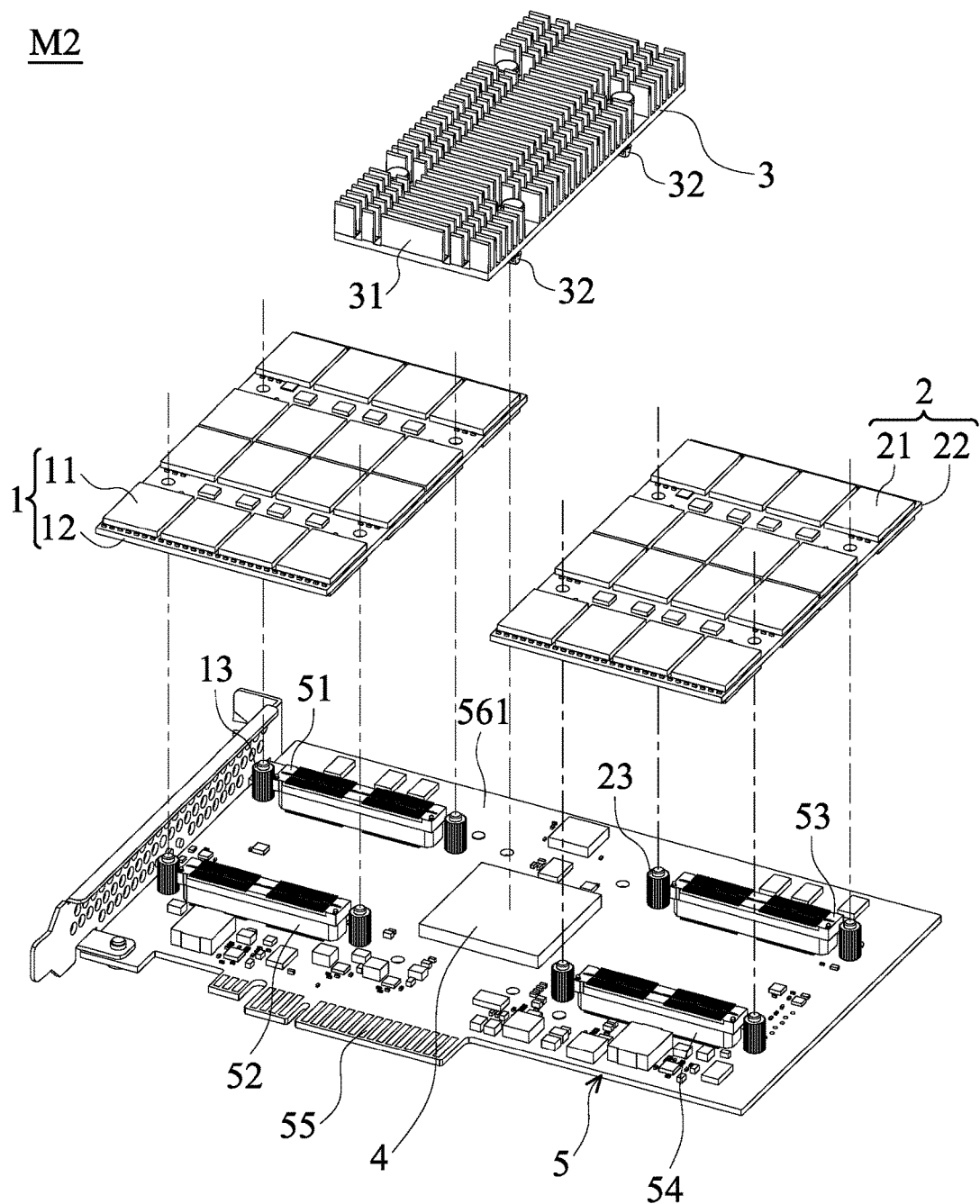
FIG. 2A is an exploded view of a memory device of a second embodiment of the invention.
Figure 2B:
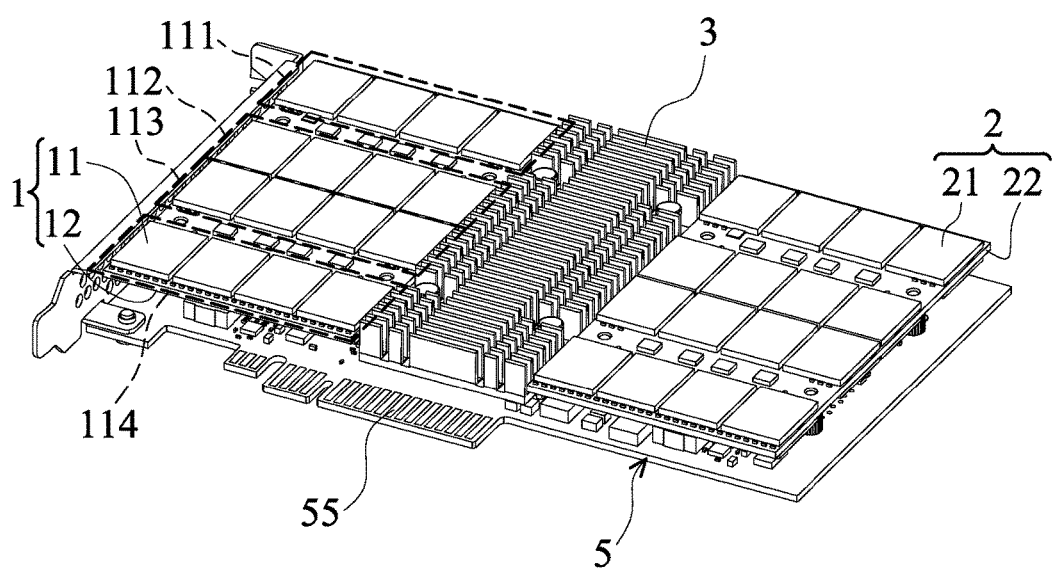
FIG. 2B shows the assembled memory device of the second embodiment of the invention.

FIGS. 2A and 2B shows a memory device M2 of a second embodiment of the invention. In this embodiment, the first memory unit 1 comprises a first daughter board 12. The second memory unit 2 comprises a second daughter board 22. The first memory chips 11 are disposed on the first daughter board 12. The second memory chips 21 are disposed on the second daughter board 22. The first daughter board 12 and the second daughter board 22 are coupled to the motherboard 5. In the second embodiment, the memory chips are coupled to the motherboard via the daughter boards to increase the flexibility of design.

With reference to FIGS. 2A and 2B, in the second embodiment, the motherboard 5 comprises a first connector 51, a second connector 52, a third connector 53 and a fourth connector 54. The first daughter board 12 is connected to the first connector 51 and a second connector 52. The second daughter board 22 is connected to the third connector 53 and the fourth connector 54. In this embodiment, the daughter boards are coupled to the motherboard via the connectors to make the replacement of the memory units conveniently.

With reference to FIGS. 2A and 2B, in the second embodiment, the heat sink 3 comprises a plurality of fins 31. The extending direction of the fins 31 is preferably in parallel to the extending direction of the first connector 51, the second connector 52, the third connector 53 and the fourth connector 54. In one embodiment, the arrangement direction of the memory chips is parallel to the extending direction of the fins 31 to improve air convection. In this embodiment, the second memory device M2 is a full-height peripheral component interconnect (PCI) memory card. The first memory chips 11 sequentially comprise a first chip row 111, a second chip row 112, a third chip row 113 and a fourth chip row 114. The first connector 51 is located between the first chip row 111 and the second chip row 112. The second connector 52 is located between the third chip row 113 and the fourth chip row 114. In one embodiment, the height of the fins 31 is substantial 8 mm. The memory device further comprises a thermal pad. The thermal pad is sandwiched between the heat sink 3 and the controller 4. The thickness of the thermal pad is substantial 0.13 mm. Utilizing the dimensions of the design of the fins and the thermal pad, though there is a gap between the controller 4 and the fan, the heat generated by the controller can still be sufficiently dissipated.

Figure 2C:
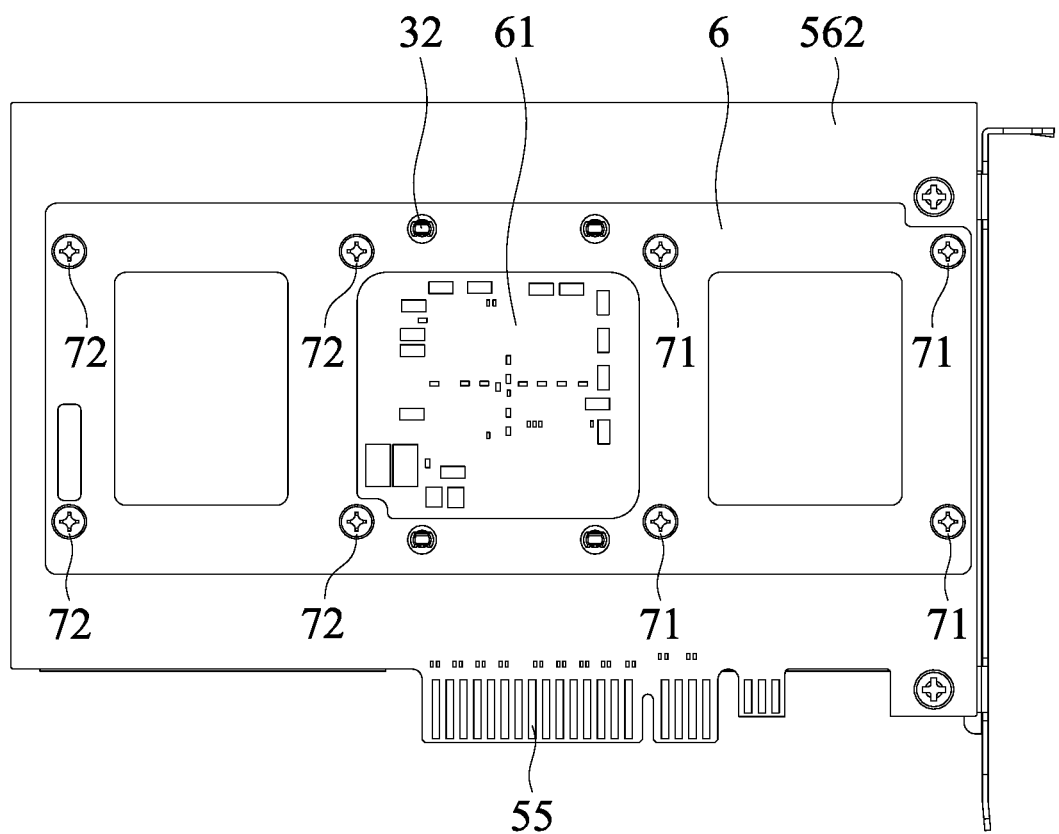
FIG. 2C is a bottom view of the memory device of the second embodiment of the invention.

With reference to FIG. 2C, in one embodiment, the memory device M2 further comprises a metal plate 6. The motherboard 5 comprises a first surface 561 and a second surface 562. The controller 4 is disposed on the first surface 561. The metal plate 6 is affixed to the second surface 562 by screws. The metal plate 6 is disposed to increase the strength of the whole memory device M2, and prevents the motherboard 5 from bending. In one embodiment, the metal plate 6 has an opening 61 to reduce the required material and, thus, weight.

With reference to FIG. 2C, in one embodiment, the memory device further comprises a plurality of first fasteners (for example, screws) 71 and a plurality of second fasteners (for example, screws) 72. The first daughter board 12 comprises a plurality of first connection posts 13. The second daughter board 22 comprises a plurality of second connection posts 23. The first fasteners 71 pass the metal plate 6 and the motherboard 5 and are affixed to the first connection posts 13. The second fasteners 72 pass the metal plate 6 and the motherboard 5 and are affixed to the second connection posts 23. By the first fasteners 71 and the second fasteners 72, the daughter boards, the motherboard and the metal plate are affixed to each other. In one embodiment, the motherboard 5 comprises a metal layer (not shown). The metal plate 6 is thermally connected to the metal layer by the first fasteners 71 and the second fasteners 72 to improve heat dissipation. In one embodiment, the heat sink 3 is connected to the metal plate 6 by the clasps 32, the clasps 32 are made of metal, and the metal plate 6 is thermally connected to the heat sink 3.

In the embodiments above, the connection posts can be connected to the daughter boards by riveting, welding or tightly fitting. The connection posts can be pre-connected to the daughter boards, and then be affixed to the metal plate and the motherboard by screws. In another embodiment, the connection posts can be pre-affixed to the metal plate and the motherboard by screws, and then be tightly fit to the daughter boards. In further another embodiment, for example, the memory device has no metal plate, the connection posts can be pre-affixed to the motherboard by screws, and the fasteners pass the daughter boards and are affixed to the connection posts to fasten the daughter boards.

Figure 3:
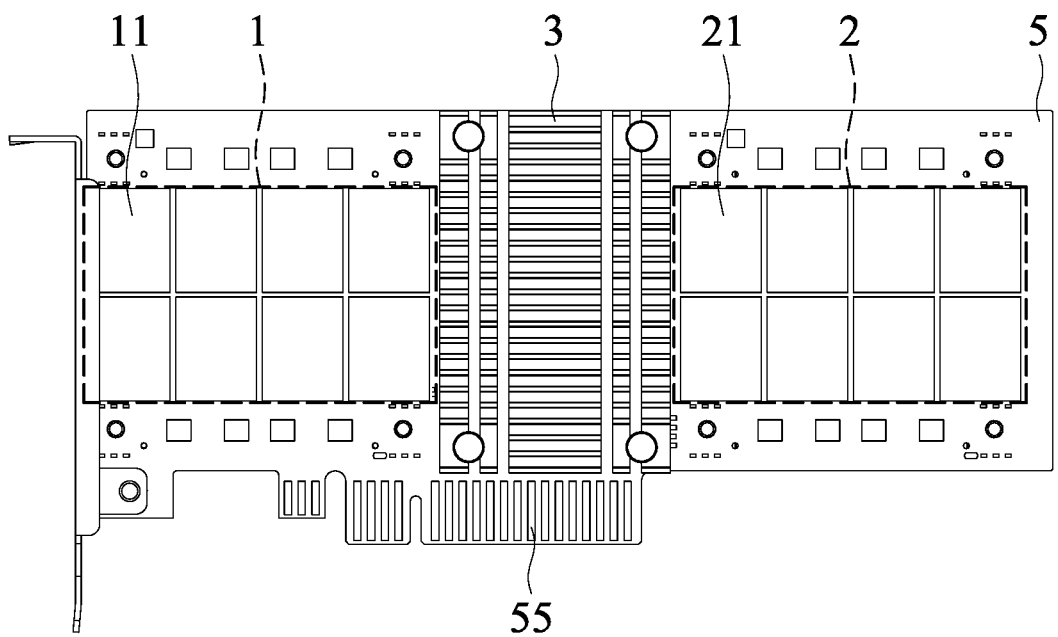
FIG. 3 shows a memory device of a third embodiment of the invention.
Figure 4A:
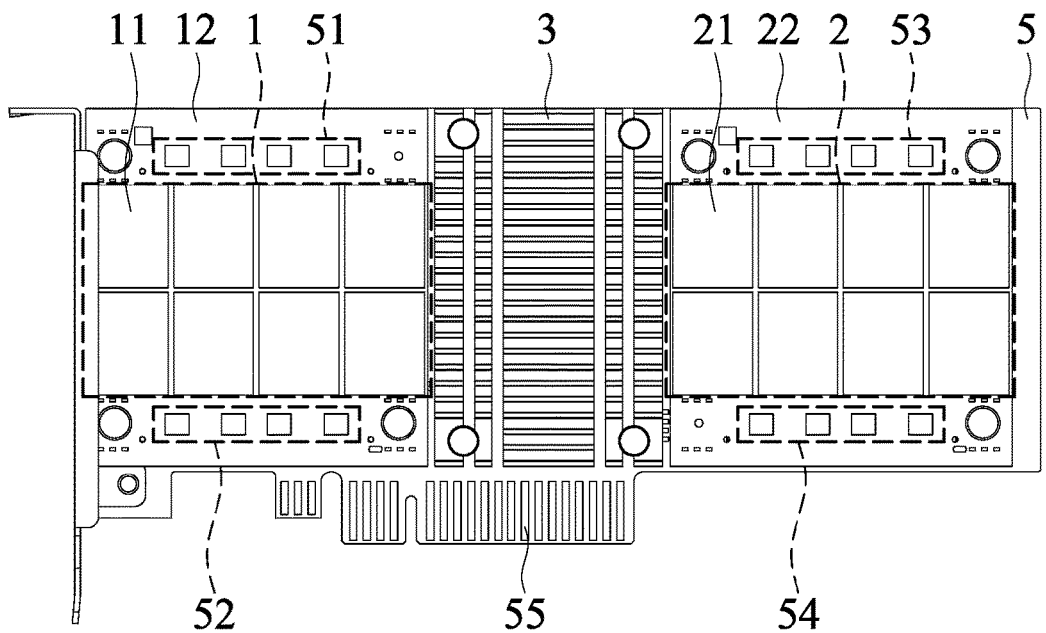
FIG. 4A is a top view of a memory device of the fourth embodiment of the invention.
Figure 4B:
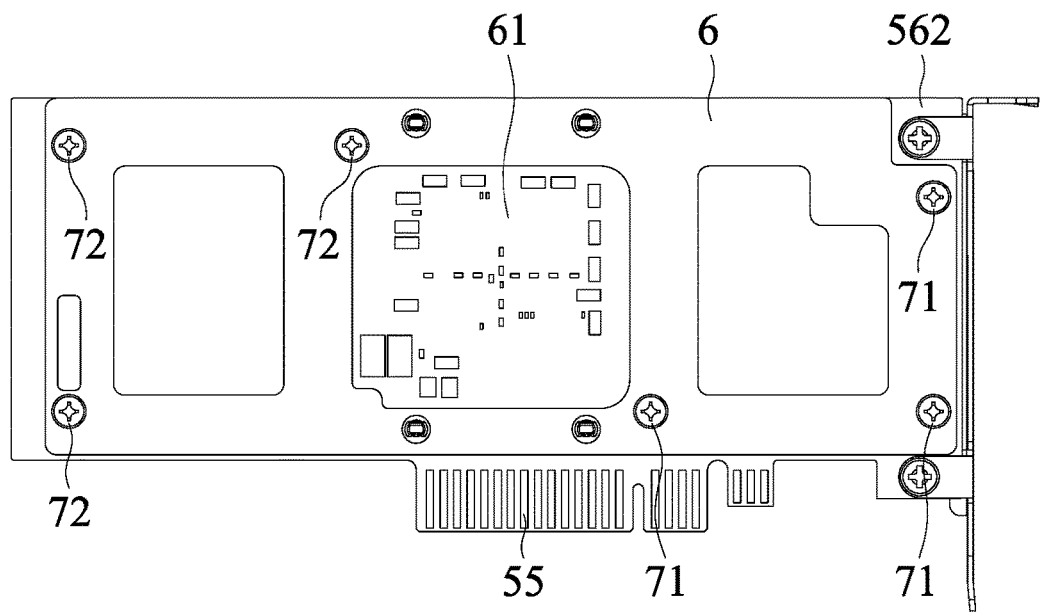
FIG. 4B is a bottom view of the memory device of the fourth embodiment of the invention.

With reference to FIG. 3, in a third embodiment, the memory device M3 is a half-height peripheral component interconnect memory card. The first memory chips 11 and the second memory chip 21 are disposed on the motherboard 5. With reference to FIGS. 4A and 4B, in a fourth embodiment, the memory device M4 is a half-height peripheral component interconnect (PCI) memory card. Similar to the embodiment above, the first memory unit 1 comprises a plurality of first memory chips 11 and a first daughter board 12. The second memory unit 2 comprises a plurality of second memory chips 21 and a second daughter board 22. The motherboard 5 comprises a first connector 51, a second connector 52, a third connector 53 and a fourth connector 54. The space on the half-height peripheral component interconnect memory card is limited. Therefore, in one embodiment, the first memory chips 11 are located between the first connector 51 and the second connector 52. In other words, the first connector 51 and the second connector 52 are connected to the edges of the first daughter board 12. In one embodiment, due to limited space on the half-height peripheral component interconnect memory card, the number of first fasteners 71 can only be three.

Figure 5:
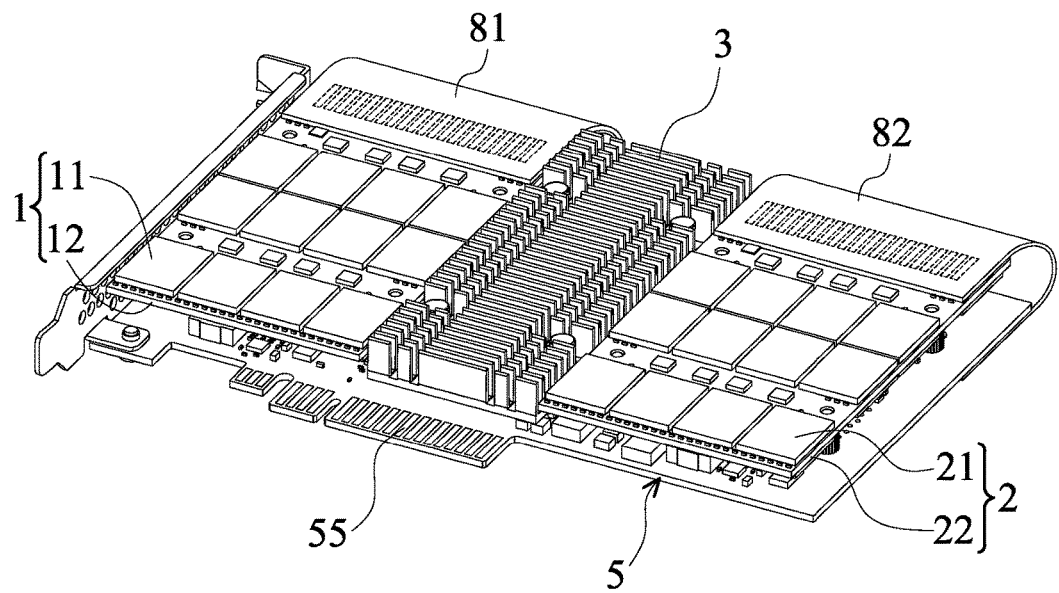
FIG. 5 shows a memory device of a fifth embodiment of the invention.

FIG. 5 shows a memory device M5 of a fifth embodiment of the invention. The memory device M5 further comprises a first flexible print circuit 81 and a second flexible print circuit 82. The first daughter board 12 is coupled to the motherboard 5 by the first flexible print circuit 81. The second daughter board 22 is coupled to the motherboard 5 by the second flexible print circuit 82. In this embodiment, the flexible print circuits connect the motherboard to the daughter boards to increase the reliability of the memory device M5.

Figure 6:
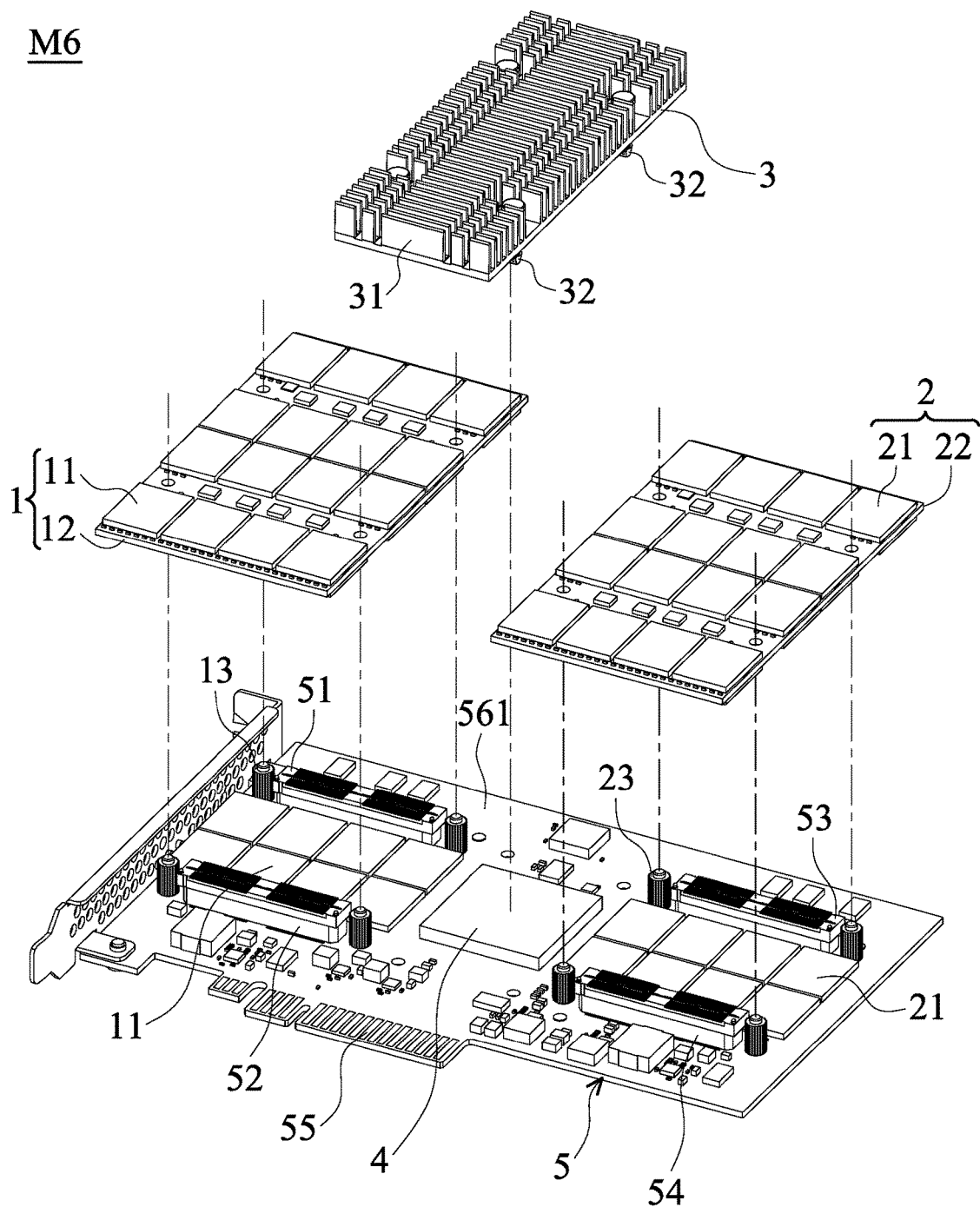
FIG. 6 shows a memory device of a sixth embodiment of the invention.

FIG. 6 shows a memory device M6 of a fifth embodiment of the invention, wherein the first memory chips 11 are simultaneously disposed on the first daughter board 12 and the motherboard 5, and the second memory chips 21 are simultaneously disposed on the second daughter board 22 and the motherboard 5. Therefore, the number of memory chips of the memory device is increased.

In the embodiment above, the full-height peripheral component interconnect memory card has dimensions of 107 mm×312 mm. The half-height peripheral component interconnect memory card has dimensions of 106.68 mm×175.26 mm. However, the disclosure is not meant to restrict the invention. The memory device of the embodiment of the invention can be another type of memory device, or one with different dimensions.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
   a motherboard, wherein the motherboard comprises a contact portion;
   a controller, disposed on the motherboard and corresponding to the contact portion;
   a first memory unit, coupled to the motherboard, wherein the first memory unit is located on one side of the controller, and the first memory unit comprises a plurality of first memory chips;
   a second memory unit, coupled to the motherboard, wherein the second memory unit is located on another side of the controller, and the second memory unit comprises a plurality of second memory chips;
   a heat sink, thermally connected to the controller, wherein the heat sink is located between the first memory unit and the second memory unit, wherein number of first memory chips is equal to number of second memory chips, wherein the first memory unit comprises a first daughter board, the second memory unit comprises a second daughter board, the first memory chips are disposed on the first daughter board, the second memory chips are disposed on the second daughter board, and the first daughter board and the second daughter board are coupled to the motherboard;
   a metal plate, wherein the motherboard comprises a first surface and a second surface, the controller is disposed on the first surface, and the metal plate is affixed to the second surface, wherein the motherboard comprises a first connector, a second connector, a third connector and a fourth connector, the first daughter board is connected to the first connector and a second connector, and the second daughter board is connected to the third connector and the fourth connector; and
   a plurality of first fasteners and a plurality of second fasteners, the first daughter board comprises a plurality of first connection posts, the second daughter board comprises a plurality of second connection posts, the first fasteners pass the metal plate and the motherboard and are affixed to the first connection posts, and the second fasteners pass the metal plate and the motherboard and are affixed to the second connection posts.

2. The memory device as claimed in claim 1, wherein the motherboard comprises a metal layer, and the metal plate is thermally connected to the metal layer.

3. The memory device as claimed in claim 1, wherein the heat sink comprises a plurality of fins, and an extending direction of the fins is parallel to an extending direction of the first connector, the second connector, the third connector and the fourth connector.

4. The memory device as claimed in claim 1, wherein the memory device is a full-height peripheral component interconnect memory card, the first memory chips sequentially comprise a first chip row, a second chip row, a third chip row and a fourth chip row, the first connector is located between the first chip row and the second chip row, and the second connector is located between the third chip row and the fourth chip row.

* * * * *